(12) United States Patent
Lin

(10) Patent No.: US 6,784,556 B2
(45) Date of Patent: Aug. 31, 2004

(54) DESIGN OF INTERCONNECTION PADS WITH SEPARATED PROBING AND WIRE BONDING REGIONS

(75) Inventor: Paul T. Lin, Fremont, CA (US)

(73) Assignee: Kulicke & Soffa Investments, Inc., Wilmington, DE (US)

(*) Notice: Subject to any disclaimer, the term of this patent is extended or adjusted under 35 U.S.C. 154(b) by 0 days.

(21) Appl. No.: 10/126,328

(22) Filed: Apr. 19, 2002

(65) Prior Publication Data

US 2003/0197289 A1 Oct. 23, 2003

(51) Int. Cl.[7] .................. H01L 23/48; H01L 23/52; H01L 29/40
(52) U.S. Cl. ............................................. 257/784
(58) Field of Search ................. 257/48, 734, 737, 257/739, 773, 779, 780, 784, 775, 786; 324/754, 758, 765; 438/14–18, 612

(56) References Cited

U.S. PATENT DOCUMENTS 5,923,047 A * 7/1999 Chia et al. .................. 257/48
6,037,668 A    3/2000 Cave et al.
6,143,396 A    11/2000 Saran et al.
6,166,556 A * 12/2000 Wang et al. ................. 324/765
6,342,399 B1 * 1/2002 Degani ........................ 438/14
6,563,226 B2 * 5/2003 Harun et al. ................ 257/784
6,579,734 B2 * 6/2003 Aoki ........................... 438/15

OTHER PUBLICATIONS

Webster's Ninth New Collegiate Dictionary, Merriam–Webster Inc, 1987, p 767.*
Hothchkiss et al., "Effects of Probe Damage on Wire Bond Integrity" *2001 Electronic Components and Technology Conference* (2001) IEEE 6 pages total.

* cited by examiner

Primary Examiner—David A. Zarneke
(74) Attorney, Agent, or Firm—Townsend and Townsend and Crew LLP

(57) ABSTRACT

The present invention provides a solution to the problem of weakening bond integrity in integrated circuit devices due in part to test probes galling and weakening the interconnect pads during functional and reliability test probing. In doing so, the invention enables a lowering of the chance a bond wire or interconnect pad will be lifted during a wire bonding process or in normal operation of an integrated circuit device.

9 Claims, 5 Drawing Sheets

DESIGN OF INTERCONNECTION PADS WITH SEPARATED PROBING AND WIRE BONDING REGIONS

BACKGROUND OF THE INVENTION

The present invention relates to the manufacturing, testing, and packaging of integrated circuits. Specific embodiments of the invention relate to an integrated circuit structure that includes an interconnect pad having first and second separate regions for bonding and probing the pad, respectively, and a method for forming and testing such a structure. The apparatus and methods of the present invention are also of use with other devices that are probe tested and have wire-bonding connections such as semiconductor packaging (e.g., flipchip, BGA, and multi-chip modules) and other printed or ceramic circuit boards. The apparatus and method of the present invention are of use with a variety of interconnection pad material, such as, gold, aluminum, copper, gold plated aluminum, and the like.

Integrated circuit performance and reliability are typically evaluated at the wafer level prior to packaging. Wafer level testing typically includes mechanically probing interconnect pads on the wafer to electrically test the wafer's electronic structures. Interconnect pads provide the electrical connection between the wafers electronic structures and the outside world. Probing interconnect pads causes galling of the pads that may cause the pad to fail during a wire bonding process, during a stress test of a wire bond or during normal use of an integrated circuit device, or may simply weaken the interconnect pads.

Traditionally, interconnect pads were probed no more than one or two times as additional probing often left interconnect pads galled to such an extent that wire bonding to the pads was impractical. As integrated circuits have become more complex, however, it is sometimes desirable to probe interconnect pads multiple times to perform a variety of functions and/or tests on the integrated circuit. For example, memory devices, such as flash memory, may be initially probed for general functionality testing and to program the memory cells. The memory device may be probed a second, third, or mores times subsequent to being baked to determine the quality of the memory cells. Other integrated circuit devices may have pads that are probed as many as seven, eight, or more times prior to wire bonding. Each probing of an interconnect pad increases the chance the pad will fail during wire bonding or subsequent.

One aspect of increasing integrated circuit complexity is the circuits continue to become smaller. Smaller integrated circuits have driven a desire for interconnect pads that are relatively smaller, have finer pitch, and have smaller spacing between the pad edges. Relatively smaller interconnect pads have smaller surface area to adhere to underlying integrated circuit structures increasing the chance pads will be lifted during a wire bonding process or during normal use of the device. Moreover, as the size of interconnect pads has been driven down so too has the size of probes used to probe the pads. Probes of relatively smaller size have relatively sharper tips and tend to increase pad galling during probing. Accordingly, relatively smaller interconnects pads are further limited in the number of times the pads may be probed prior to being galled to such an extent that wire bonding is not practical.

Increased complexity of integrated circuit devices has not only driven down interconnect pad size and pitch, increased complexity has also driven an increase in the number of interconnect pads on a given device. Earlier generations of integrated circuit devices typically had a few to several tens of interconnects pads per device. Today's increasingly complex integrated circuit devices may have hundreds if not thousands of interconnect pads. As the number of interconnect pads increases so to does the number of probes required to probe a device. Keeping hundreds, and possibly thousands, of probes on a probing device optimally coplanar is relatively costly. As a probing device is repeatedly used the probes deviate from optimum coplanarity and thus require greater overdriving forces to ensure all probes mechanically contact their designate interconnect pads. Increased overdriving causes the probes to gall the interconnect pads more severely than lower driving forces used for more optimally coplanar probes.

Solutions have been sought to support interconnect pads from underneath to limits the deleterious effects of probing on structures underlying a pad. For example, solutions have been sought to place shock-absorbing structures below a pad to prevent such damage. However, while shock-absorbing structures under interconnect pads may protect structures underlying the pad, the pad itself remains vulnerable to probe damage that may lead to subsequent lifting of the pad during wire bonding or normal use of an integrated circuit device.

Accordingly, the semiconductor industry continues to develop new interconnect pads that suffer less from the deleterious effect caused by multiple probing, decreased pad size, wire bonding, and general device use.

BRIEF SUMMARY OF THE INVENTION

The present invention provides a solution to the problem of lifting bond wires and lifting interface pads in integrated circuit devices due in part to test probes galling and weakening the interconnect pads during functional and reliability test probing. In doing so, the invention enables a lowering of the chance a bond wire will be lifted in normal operation of an integrated circuit and enables a lowering of the chance an interconnect pad will be lifted during a wire bond process or in the normal operation of an integrated circuit.

According to one embodiment of an apparatus of the present invention, an integrated circuit has an interconnect region that includes an interconnect pad having a first portion and a second portion. A dielectric passivation layer overlies portions of the integrated circuit device and has first and second opening corresponding to and exposing the first and second portions of the interconnect pad. A portion of the passivation layer overlies a portion of the interconnect pad between the first portion and the second portion of the pad.

In another embodiment of the invention, an integrated circuit has an interconnect region that includes an interconnect pad having a first portion and a second portion and a visible indicator indicates the division between the first portion and the second portion of the interconnect pad.

According to one embodiment of a method of the present invention, an interconnect pad is formed on an integrated circuit device wherein the interconnect pad has first and second portion and the second portion is probed by a probing device and a bond wire is bonded to the first portion of the interconnect pad.

These and other embodiments of the present invention, as well as its advantages and features, are discussed in more detail in conjunction with the text below and attached figures.

DETAILED DESCRIPTION OF THE INVENTION

Figure 1A:
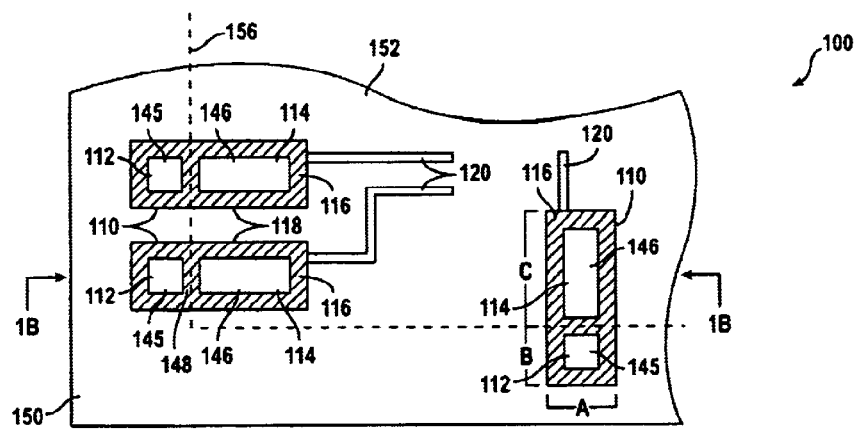
FIGS. 1A and 1B are simplified top and cross-sectional views of a portion of an integrated circuit having a plurality of interconnect pads according to the present invention.
Figure 1B:
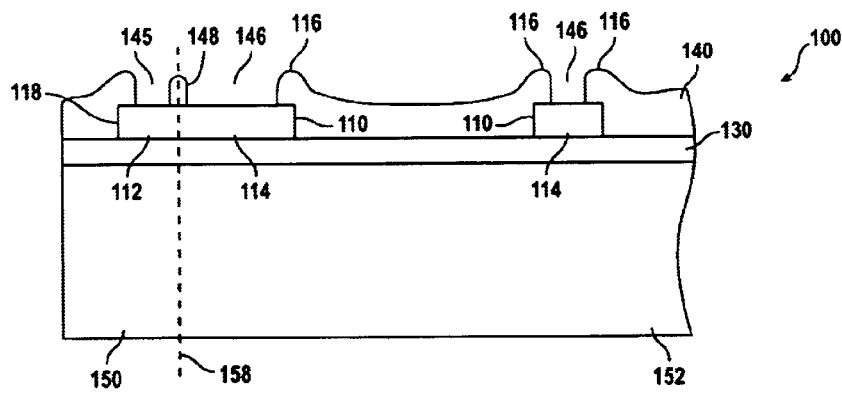

FIGS. 1A and 1B are simplified top and cross-sectional views, respectively, of a portion of an integrated circuit 100 having a plurality of interconnect pads 110 according to one embodiment the present invention. Each interconnect pad 110 is coupled to a metal trace 120 that is further coupled to other integrated circuit electronics (not shown). The interconnect pads are metal pads and may include, for example, gold, aluminum, copper, gold plated aluminum, and the like. A dielectric layer 130 underlies and surrounds portions of the interconnect pads. Dielectric layer 130 may include, for example, silicon dioxide or other electrically insulative material. The dielectric layer electrically insulates the interconnect pads from each other and from other electronic structures of the integrated circuit. The dielectric layer also provides a surface to which the interconnect pads attach.

To passivate the integrated circuit, a dielectric passivation layer 140 is formed over the integrated circuit. Passivation layers are well known in the art to provide a hermetic seal and to limit scratching of underlying integrated circuit structures. The passivation layer may include, for example, silicon nitride deposited in a plasma enhanced chemical vapor deposition process or other electrically insulative material. The dielectric passivation layer 140, according to the present invention, has a plurality of first openings 145 and a plurality of second openings 146. The openings may be formed by wet or dry etching or other processes. Each of the first openings exposes a first portion 112 of the interconnect pads and each second opening exposes a second portion 114 of the interconnect pads. A portion 148 of the dielectric passivation layer lies between the first and second openings and separates the first and second portions of the interconnect pads. Dielectric passivation layer 140 is shown to overlie a side portion 116 of each of the interconnect pads. In FIG. 1A the portion of the dielectric passivation layer overlying the interconnect pads is shown with hatching marks. For convenience, in the view of FIG. 1B, taken along line 1B—1B of FIG. 1A, the overlying portion of the dielectric passivation layer is not shown with hatching marks. The dielectric passivation layer may, alternatively, be coextensive with sides 118 of the interconnect pads or may extend beyond the pad sides leaving portions of dielectric layer 130 exposed.

In some embodiments of the invention, the first portion 112 of each interconnect pad overlies an "inactive region" of integrated circuit 100 and the second portion 114 of each interconnect pad overlie an "active region" of an integrated circuit as shown in FIGS. 1A and 1B. As referred to herein, an inactive region is a region of an integrated circuit not having transistor devices. However, the inactive regions may contain other devices such as resistors, capacitor, and the like. As referred to herein, an active region is a region of an integrated circuit that may contain transistor devices. According to one embodiment of the present invention, an inactive region 150 lies along the periphery of integrated circuit 100 and an active region 152 lies inside the periphery defined by inactive region 150. Dividing lines 156 and 158, shown as dashed, indicate the division between these two regions. According to an alternate embodiment, the inactive region does not extend along the periphery of the integrated circuit but is limited to underlying the first portion of each of the interconnect pads.

According to some embodiments of the present invention, an interconnect pad's first portion 112 has a smaller area than the pad's second portion 114. According to a specific embodiment, the area of the second portion of an interconnect pad is about 4.3 to 1.3 time larger than the area of the first portion of an interconnect pad. According to a further specific embodiment, interconnect pad dimensions A and B are each about 30–40 microns and dimension C is about 50–75 microns.

The first portion 112 of each interconnect pad 110 is a bonding portion for bonding wires, solder balls, and the like. Wire bonding, as is well known in the art, is a process whereby a bond wire, such as a gold or aluminum wire, is metallurgically bonded to an interconnect pad. Typically, the bond wire is held by a capillary and ultrasonically scrubbed against an interconnect pad to form the metallurgic bond. The bond wire may subsequently be ultrasonically scrubbed against another pad forming an electrical connection between the interconnect pad and other pad.

Figure 2:
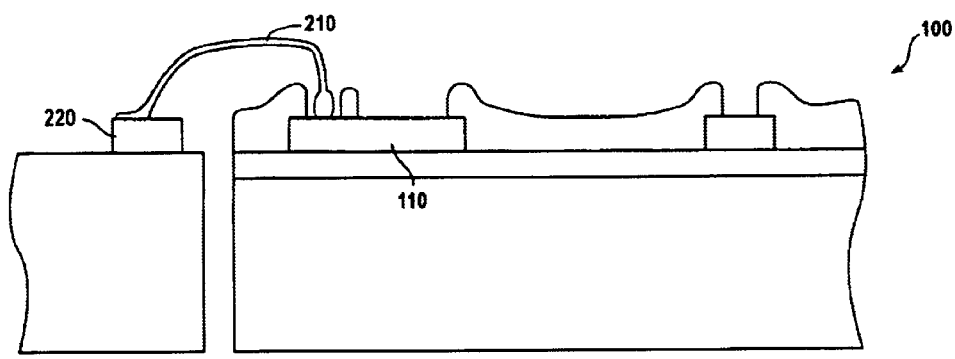
FIG. 2 is a simplified cross-sectional view of an integrated circuit having a bond wire metallurgically bonded to an interconnect pad according to the present invention.

FIG. 2 is a simplified cross-sectional view of an integrated circuit 100 having a bond wire 210 metallurgically bonded to an interconnect pad 110 according to the present invention. Bond wire 210 is bonded to the first portion 112 of the interconnect pad and is bonded to another pad 220. FIG. 2 is not shown to scale but is provided for purposes of example. The other pad may be, for example, the interconnect pad of another integrated circuit, such as an integrated circuit and interconnect pad of the present invention. Alternatively, the other pad may be, for example, the lead frame pad of an integrated circuit package, such as a dual in line package, thin quad flat pack, and the like.

Referring again to FIG. 1, the second portion 114 of interconnect pads 110 is a probing portion. Probing, as is well know in the art, is a process whereby a probe, such as a tungsten probe, is placed in mechanical contact with an interconnect pad. Electrical signals are passed between the probe and interconnect pad to perform functional tests on an integrated circuit. According to an embodiment of the present invention, probing is not performed on the first portion of interconnect pads 110 and bonding is not performed on the second portion of the interconnect pads. In other words, bonding is not performed on portions of the interconnect pad that may be galled by probing.

Figure 3A:
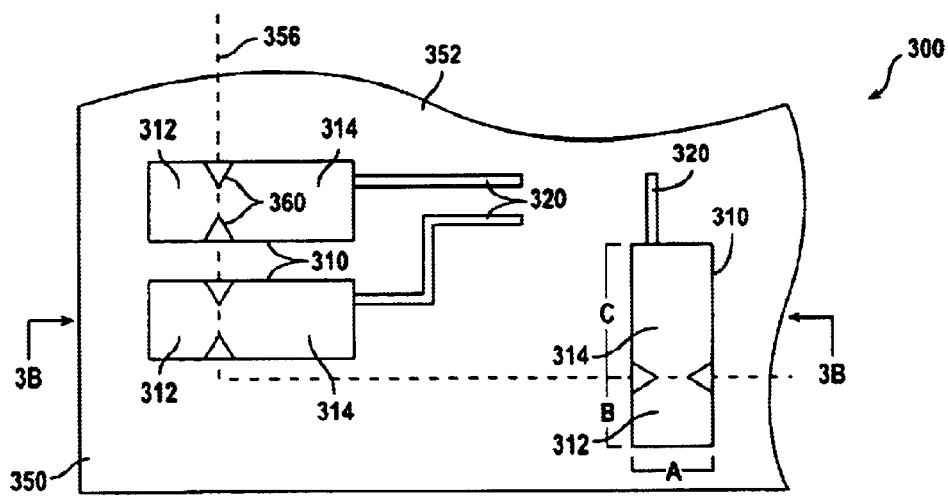
FIGS. 3A and 3B are simplified top and cross-sectional views of an integrated circuit having a plurality of interconnect pads according to an embodiment of the present invention.
Figure 3B:
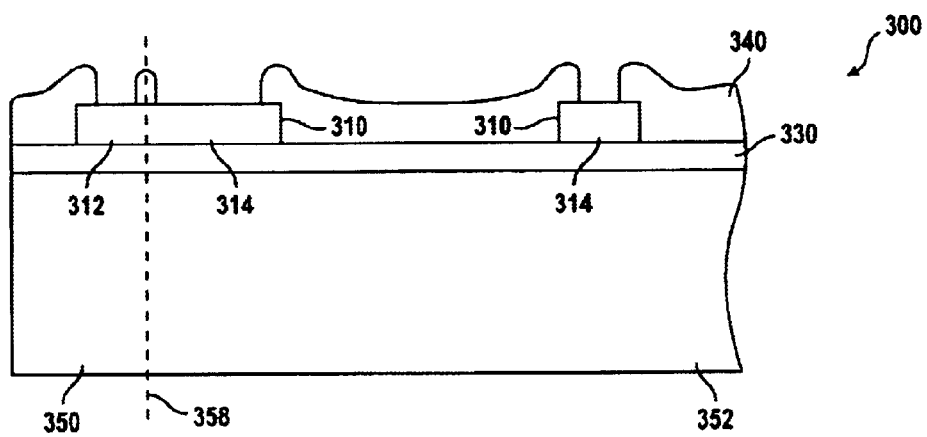

FIGS. 3A and 3B are simplified top and cross-sectional views of an in integrated circuit 300 having a plurality of interconnect pads 310 according to another embodiment of the present invention. Each interconnect pad 310 is coupled to a metal trace 320 that is further coupled to other integrated circuit electronics (not shown). The interconnect pads are metal pads and may include, for example, gold, aluminum, copper, gold plated aluminum, and the like. A dielectric layer 330 underlies and surrounds portions of the interconnect pads. The dielectric layer electrically insulates the interconnect pads from each other and other electronic structures on the integrated circuit. The dielectric layer also provides a surface to which the interconnect pads attach.

Each interconnect pad 310 has a first portion 312 and a second portion 314. According to some embodiment of the invention, the first portion of an interconnect pad overlies an inactive region of the integrated circuit and the second portion of an interconnect pad overlies an active region. As similarly described above with respect to the embodiment shown in FIG. 1, the inactive region may lie along the periphery of integrated circuit 300, such as region 350, or the inactive region may be limited to underlying the first portion of each interconnect pad. Dividing lines 356 and 358, shown as dashed, indicate the division between an inactive region 350 and an active region 352. Inactive and active regions as referred to herein are defined above.

The first portion 312 of each interconnect pad 310 is a bonding portion and the second portion 314 is a probe portion. According to a specific embodiment, the bonding portion is not a probing portion and the probing portion is not a bonding portion. In other words, bond wires are not attached to portions of the interconnect pad that may be galled during a probing process.

A dielectric passivation layer 340 overlies portions of integrated circuit 300 and has an opening corresponding to the first and second portions of each interconnect pad. Dielectric passivation layers are well known in the art and are discussed above.

According to some embodiment of the present invention, an interconnect pad's first portion 312 has a smaller area than the pad's second portion 314. According to a specific embodiment, the area of the second portion of an interconnect pad is about 4.3 to 1.3 time larger than the area of the first portion of an interconnect pad. According to a further specific embodiment, interconnect pad dimensions A and B are each about 30–40 microns and dimension C is about 50–75 microns.

The division between the first and second portions of the interconnect pads is indicated by visible indicia 360 (which are not necessarily drawn to scale). According to a specific embodiment of the present invention, visible indicia 360 are etched portions of the interconnect pad. The etched portion of the interconnect pads is along the surface of the pads and should not be sized so as to provide a current clamp between the first and second portions of the pads.

Figure 3C:
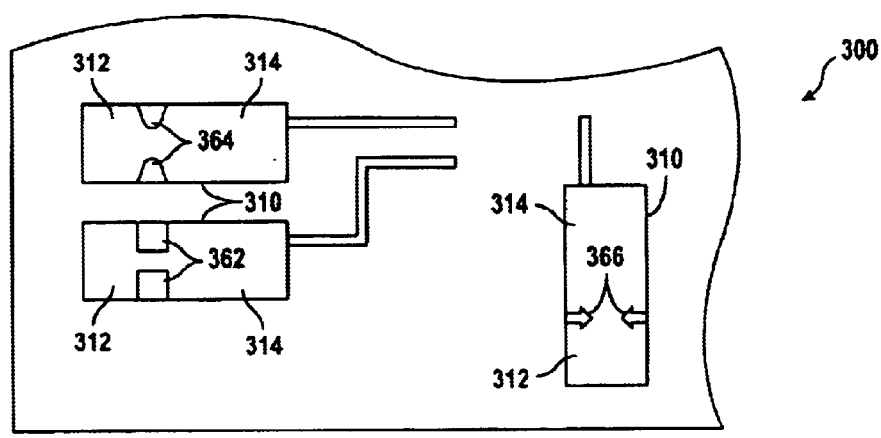
FIG. 3C shows visible indicia etched into interconnect pads having a variety of shapes.

As shown, visible indicia 360 have a triangular shape and lay on opposite sides of an interconnect pad. The visible indicia 360 may, however, have other shapes, such as rectangular, curved or any capricious shape. FIG. 3C shows visible indicia etched into interconnect pads 310 having a variety of shapes. Visible indicia 362 have a square shape, visible indicia 364 have a curved shape, and visible indicia 366 are arrow shaped. Those of skill in the art will realize that any appropriate shape may be used for the visible indicia as long as the shape can be determined to indicate the division between the first and second portions of an interconnect pad. While visible indicia 360, 362, 364, and 366 are each shown as being positioned on opposite sides of an interconnect pad, a single indicator may be placed on one side of an interconnect pad to indicate the division between the first and second portions of the pad.

Figure 3D:
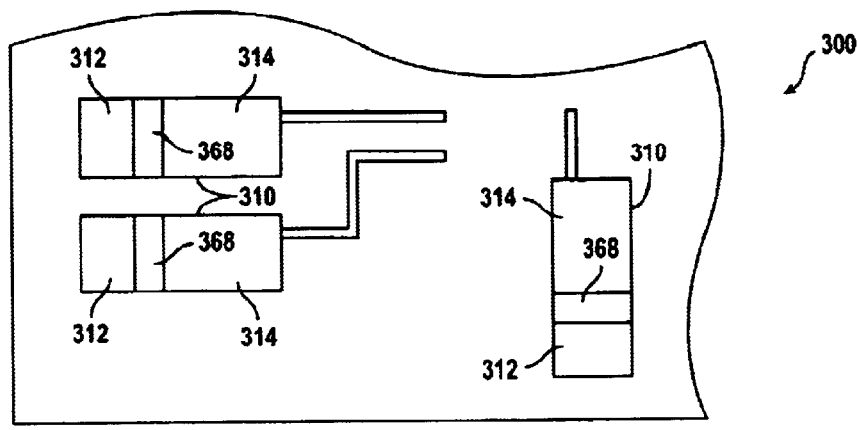
FIG. 3D shows another embodiment of the present invention having an integrated circuit having interconnect pads that each have a visible indicator that spans the width of the interconnect pads.

FIG. 3D shows another embodiment of the present invention, integrated circuit 300 has interconnect pads 310 that each have a visible indicator 368 that spans the width of the interconnect pads. According to a specific embodiment, a visible indicator 368 is a line etched in an interconnect pad. Visible indicator 368, like visible indicia 360, 362, 364, and 366, indicate the division between first and second regions 312 and 314 of interconnect pads 310. Also similar to these visible indicia, visible indicators 368 are etched along the surface of the pads and should not be sized so as to provide a current clamp between the first and second portions of the pads.

Figure 3E:
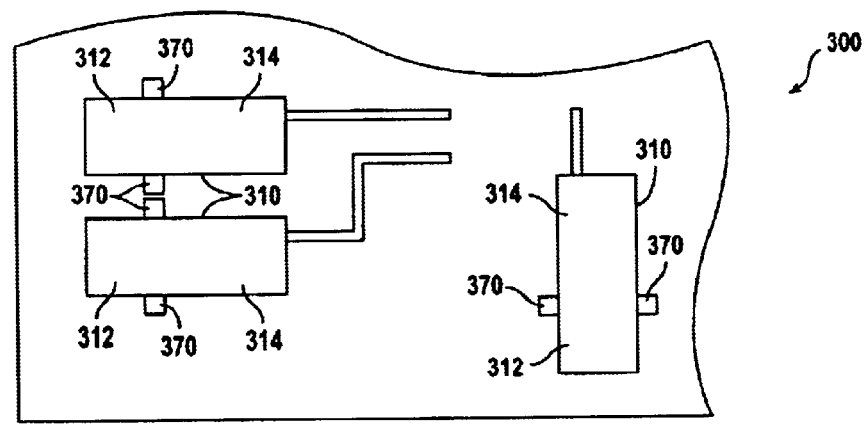
FIG. 3E is a simplified top view of another embodiment of the present invention having an integrated circuit with interconnect pads having visible indicia indicating the division between first and second portions of the interconnect pads.

FIG. 3E is a simplified top view of another embodiment of the present invention having an integrated circuit 300 with interconnect pads 310 having visible indicia 370 indicating the division between first and second portions of the interconnect pads. Different from the embodiments shown in FIGS. 3A–3D, visible indicia 370 rather than being etched into portions of the interconnect pads are etched into dielectric layer 330 (shown in cross-sectional view in FIG. 3B) that underlies and surrounds portions of the interconnect pads. The etched portions of the dielectric layer forming the indicia are along the periphery of the pads. Further, the etched portions are on the surface of the dielectric layer and should not penetrate the layer. Similar to embodiments shown in FIGS. 3A–3D, visible indicia 370 may have a variety of shapes. For example, while visible indicia 370 are shown if FIG. 3F as rectangular, the indicia may be triangular, curved, circular, arrows, or any capricious shape.

Figure 3F:
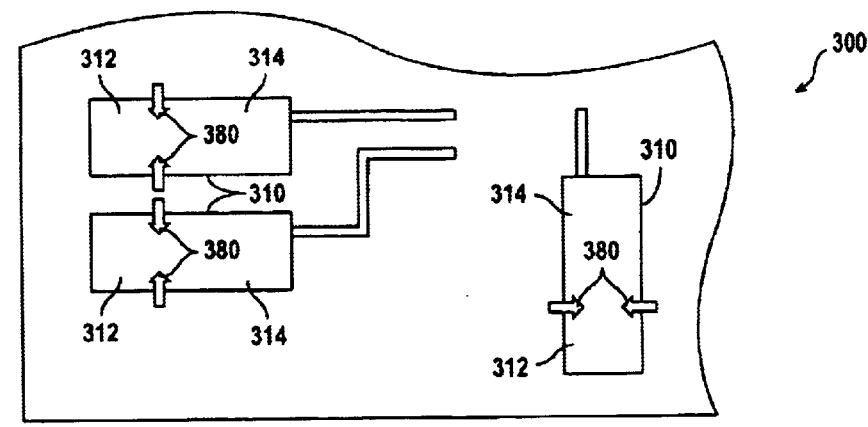
FIG. 3F is a simplified top view of another embodiment of the present invention having an integrated circuit with interconnect pads having visible indicia indicating the division between first and second portions of the interconnect pads.

FIG. 3F is a simplified top view of another embodiment of the present invention having an integrated circuit 300 with interconnect pads 310 having visible indicia 380 indicating the division between first and second portions of the interconnect pads. Different from the embodiments shown in FIGS. 3A–3E, visible indicia 380 are etched into both the interconnect pads 310 and dielectric layer 330 (shown in cross-sectional view in FIG. 3B). Visible indicia 380 have an arrow shape with the tips of the arrows pointing along the division between the first and second portions of an interconnect pad. Similar to embodiments shown in FIGS. 3A–3E and described above, visible indicia 380 may have a variety of shapes.

Figure 3G:
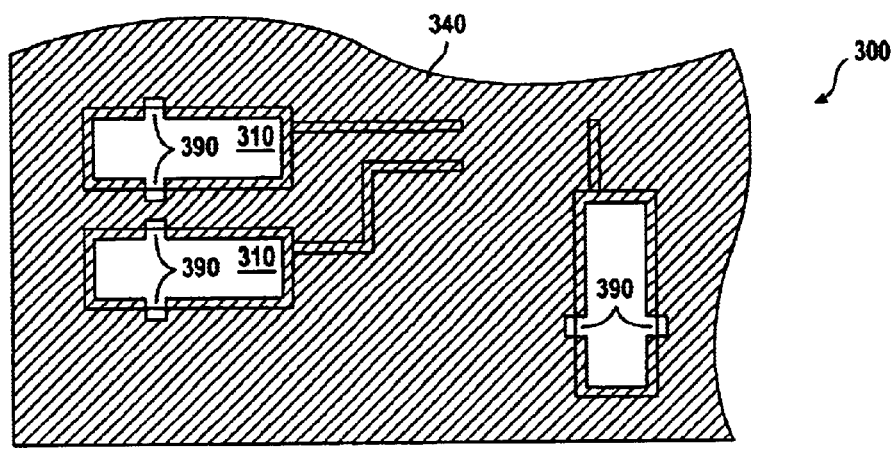
FIG. 3G is a simplified top view of another embodiment of the present invention having an integrated circuit with interconnect pads having visible indicia indicating the division between first and second portions of the interconnect pads.

FIG. 3G is a simplified top view of another embodiment of the present invention having an integrated circuit 300 with interconnect pads 310 having visible indicia 390 indicating the division between first and second portions of the interconnect pads. Different from the embodiments shown in FIGS. 3A–3F, visible indicia 390 are etched into dielectric passivation layer 340 (shown with hatch marks) that overlies portions of the integrated circuit. Visible indicia 390 are shown as rectangular but may have a variety of shapes such as those discussed above.

Figure 3H:
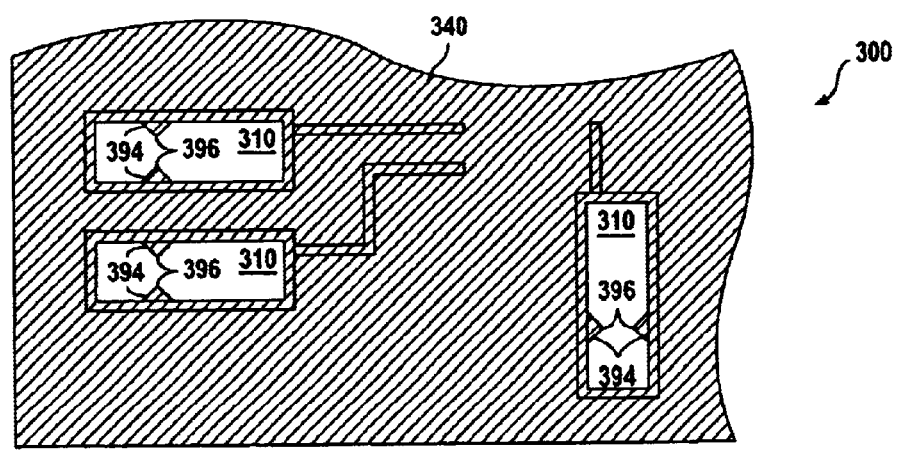
FIG. 3H shows another embodiment of the present invention having an integrated circuit with interconnect pads that each have visible indicia that are nib portions of a dielectric passivation layer.

FIG. 3H shows another embodiment of the present invention, integrated circuit 300 has interconnect pads 310 that each have visible indicia 394 that are nib portions of dielectric passivation layer 340 (shown with hatch marks). Visible indicia 394 are shown as triangular in shape having an apex 396 pointing along the division between the first and second portions of the interconnect pads. Similar to embodiments shown in FIGS. 3A–3G and described above, visible indicia 394 may have a variety of shapes.

Visible indicia 390 and 394 are each shown as being positioned on opposite sides of interconnect pads 310, however, a single indicator (etched or nib) in the dielectric passivation layer, may be placed on one side of an interconnect pad to indicate the division between the first and second portions of the pad.

Figure 4:
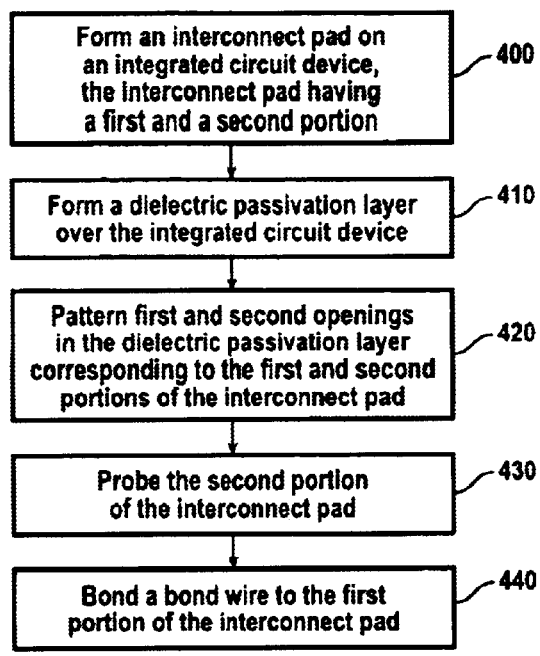
FIG. 4 is a flow chart of a method according to an embodiment of the present invention.

FIG. 4A is a flow chart of a method according to an embodiment of the present invention. The method includes a step 400 in which an interconnect pad (e.g., interconnect pads 110 in FIG. 1) is formed on an integrated circuit device (e.g., integrated circuit 100 in FIG. 1) the interconnect pad having first and second portions. The interconnect pad may be formed on the integrated circuit by a variety of processes, such as, chemical vapor deposition, plasma enhanced chemical vapor deposition, and the like. Those of skill in the art will know of other processes for forming interconnect pads.

Next in step 410, a dielectric passivation layer (e.g., layer 140 in FIG. 1A) is formed over the integrated circuit. The dielectric passivation layer may be, for example, a silicon nitride layer formed by plasma enhanced chemical vapor deposition.

Next in step 420, the dielectric passivation layer is patterned to include first and second openings corresponding to the first and second portions of the interconnect pad. The patterning may include, for example, masking and etching the openings via wet or dry chemical etch.

Next in step 430, the second portion of the interconnect pad is probed by a probing device. As discussed above, probing is typically performed to test the functionality and reliability of an integrated circuit device. To make electrical connection with an integrated circuit a probe is placed in mechanical contact with an interconnect pad so that electrical signals may be passed between the pad and probe to provide the testing.

Next in step 440, a bond wire is attached to the first portion of the interconnect pad, (e.g., bond wire 210 in FIG. 2). As discussed above, the bond wire may be attached to the interconnect pad by ultrasonically scrubbing the bond wire across the pad forming a metallurgical bond between the wire and pad. Ultrasonically scrubbing the bond wire in the first portion of the interconnect pad provides that the bond wire is attached to portions of the interconnect pad free of galling marks formed in probing step 430.

According to an alternative step 420, a single opening (e.g., layer 340 in FIGS. 3G and 3H) corresponding to both the first and second openings is patterned in the dielectric passivation layer. Visible indicia (e.g., visible indicia 390 and 396 in FIGS. 3G and 3H) are also patterned into the dielectric passivation layer indicating the division between the first and second portions of the interconnect pad. Patterning may include, for example, masking and etching the dielectric passivation layer.

Figure 5:
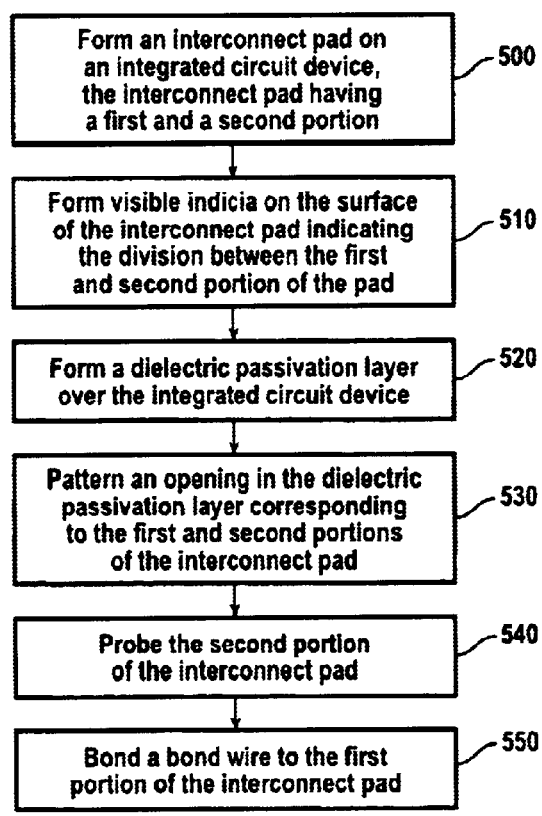
FIG. 5 is a flow chart of a method according to another embodiment of the present invention.

FIG. 5A is a flow chart of a method according to another embodiment of the present invention. The method includes a step 500 in which an interconnect pad (e.g., interconnect pads 310 in FIG. 3A) is formed on an integrated circuit device (e.g., integrated circuit 300 in FIG. 3A) the interconnect pad having first and second portions. The interconnect pad may be formed on the integrated circuit by a variety of processes, such as, chemical vapor deposition, electroplating, plasma enhanced chemical vapor deposition, and the like. Those of skill in the art will know of other processes for forming interconnect pads.

Next in step 510, visible indicia (e.g., visible indicia 360 in FIG. 3A) indicating the division between the first and second portions of the interconnect pad are formed on the pad's surface. The visible indicia may be formed, for example, by wet or dry or etching or by focused ion beam etching techniques such as reactive ion beam etching.

Next in step 520, a dielectric passivation layer (e.g., layer 140 in FIG. 1A) is formed over the integrated circuit. The dielectric passivation layer may be, for example, a silicon nitride layer formed by plasma enhanced chemical vapor deposition.

Next in step 530, the dielectric passivation layer is patterned with an opening corresponding to both the first and second portions of the interconnect pad. Patterning may include, for example, masking and etching the openings via wet or dry chemical etch as well as other processing steps.

Next in step 540, the second portion of the interconnect pad is probed by a probing device. As discussed above, probing is typically performed to test the functionality and reliability of an integrated circuit device. To make electrical connection with an integrated circuit a probe is placed in mechanical contact with an interconnect pad so that electrical signals may be passed between the pad and probe to provide the testing.

Next in step 550, a bond wire is attached to the first portion of the interconnect pad. As discussed above, the bond wire may be attached to the interconnect pad by ultrasonically scrubbing the bond wire across the pad forming a metallurgical bond between the wire and pad. Ultrasonically scrubbing the bond wire in the first portion of the interconnect pad provides that the bond wire is attached to portions of the interconnect pad free of galling marks formed in probing step 540.

While the invention has been fully described above, those skilled in the art after having read the above description will recognize alternative embodiments and equivalents. For example, the visible indicia shown in FIGS. 3A–3H may be raised portions of the interconnect pads, dielectric layer or passivation dielectric layer. For example, a nib may be build up on the dielectric layer when the layer is deposited on the integrated circuit. The nib may be placed at the division between the first and second portions of the interconnect pad as an indicator of the division. These equivalents and alternative embodiments are intended to be within the scope of the invention. Accordingly, the scope of the invention should not be limited by the examples given above, but is to be interpreted according to the claims below.

What is claimed is:

1. An integrated circuit having an interconnect region, the interconnect region comprising:

an interconnect pad having a first portion and a second portion, wherein the first portion of the interconnect pad overlies an inactive region of the integrated circuit;

a visible indicator indicating a division between the first portion and the second portion, wherein the visible indicator has a contact surface in continuous contact with the interconnect pad; and a dielectric passivation layer having an opening that exposes both the first and second portions of the interconnect pad.

2. The integrated circuit of claim 1, wherein the portion of the visible indicator is formed on a surface of the interconnect pad.

3. The integrated circuit of claim 1, wherein the visible indicator is configured as a rise above a surface of the interconnect pad.

4. The integrated circuit of claim 1, wherein the visible indicator includes a surface in constant contact with the interconnect pad.

5. The integrated circuit of claim 1, wherein the visible indicator is formed from a portion of the dielectric passivation layer.

6. The integrated circuit of claim 1, wherein the visible indicator is a nib portion of the dielectric passivation layer.

7. The integrated circuit of claim 1, wherein the second portion of the interconnect pad overlies an active region of the integrated circuit.

8. The integrated circuit of claim 1, wherein the inactive region includes a capacitor and/or a resistor.

9. The integrated circuit of claim 1, wherein the inactive region does not include transistor devices.

* * * * *